(12) United States Patent
Rangelow et al.

(10) Patent No.: US 7,141,808 B2
(45) Date of Patent: Nov. 28, 2006

(54) DEVICE AND METHOD FOR MASKLESS AFM MICROLITHOGRAPHY

(76) Inventors: Ivo Rangelow, Obere Sommerbachstrasse 45, D-34225 Baunatal (DE); Tzwetan Ivanov, Hugo Preuss Strasse 33, D-34131 Kassel (DE); Peter Hudek, Talstrasse 38, D-07743 Jean (DE); Olaf Fortagne, Käthe-Kollwitz-Strasse 15, D-07743 Jena (DE)

( * ) Notice: Subject to any disclaimer, the term of this patent is extended or adjusted under 35 U.S.C. 154(b) by 22 days.

(21) Appl. No.: 10/508,478

(22) PCT Filed: Mar. 14, 2003

(86) PCT No.: PCT/EP03/02680

§ 371 (c)(1),
(2), (4) Date: Apr. 20, 2005

(87) PCT Pub. No.: WO03/081171

PCT Pub. Date: Oct. 2, 2003

(65) Prior Publication Data

US 2005/0225011 A1    Oct. 13, 2005

(30) Foreign Application Priority Data

Mar. 21, 2002  (DE) ............... 102 12 736
Jan. 26, 2003  (DE) ............... 103 03 040

(51) Int. Cl.
*H01J 37/30*    (2006.01)

(52) U.S. Cl. ............... 250/492.2; 250/307; 250/306; 73/105; 264/485

(58) Field of Classification Search ............... None
See application file for complete search history.

(56) References Cited

U.S. PATENT DOCUMENTS 5,856,672 A    1/1999  Ried
6,189,374 B1    2/2001  Adderton et al.

OTHER PUBLICATIONS

Minne, S.C., et al., "Independent parallel lithography using the atomic force microscope", J. Vac. Sci. Technol. B. 14(4), Jul./Aug. 1996, pp. 2456-2461.

*Primary Examiner*—Nikita Wells
*Assistant Examiner*—Zia R. Hashmi
(74) *Attorney, Agent, or Firm*—Houston Eliseeva LLP (57) ABSTRACT

The invention relates to a device and a method for maskless microlithography. Several microstructured cantilevers (2) are arranged in an array (26) and an actuator is integrated in each of the cantilevers (2) of the array (26). A power supply and control unit (24) is provided, said unit adjusting the distance of the cantilevers (6) relative to a surface (4) that is to be structured by means of an appropriate voltage. Every point of the needles (6) is connected to said power supply and control unit (24). In order to implement the inventive method, an array (26) with cantilevers, each of which carries a point of a needle (6), is brought into contact with a surface (4) to be structured in such a way that the points of the needles (6) are arranged close to the surface (4) to be structured.

23 Claims, 7 Drawing Sheets

DEVICE AND METHOD FOR MASKLESS AFM MICROLITHOGRAPHY

The present invention relates to a device for maskless microlithography. In particular, the invention relates to a device for maskless microlithography with a microstructured cantilever, the free end of which is fitted with the needlepoint.

In addition, the invention relates to a method for maskless microlithography.

Progress in the research and development of microelectronic components depends primarily on the characteristics, capabilities, and flexibility of the microlithographic devices used. Progress consists, among other things, in achieving increasingly finer structures, and thereby also higher a packing density. Lithography is a technological advance in microelectronics, in which a pattern is drawn or projected onto a storage medium. As a rule, the photosensitive film is a resist. The desired pattern of the component is imprinted on the thin film, and the resultant structure in the medium is designated as a mask, in which case photons, electrons, or ions are used to do the imprinting. During processing or imprinting, respectively, fine line patterns are formed on the resist, which selectively protect the underlying substrate from chemical or physical action such as erosion, metallization, doping, or implanting, etc., during the following processing steps.

The use of electrons in lithography is limited primarily to direct serial imprinting on a substrate, or to the production of a master mask for other lithographic projection methods, mainly with high parallel throughput.

International patent application WO 00/30146 describes a method and an array for exposing a substrate. Here, the substrate is provided with a resist system consisting of n layers that are exposed or processed using corpuscular radiation. The array for exposure during processing consists of a plurality of contact points that are brought into contact with the various layers of the resist system by means of a spring element. Here, the various contact points come in contact with varying layers of the resist system in order to prevent the loading of the individual layers during structuring by corpuscular radiation. Nevertheless, exposure or processing of the substrate, respectively, continues from a single source of corpuscular radiation, which is very time-consuming in terms of processing the entire wafer- or substrate surface. The article by Kathryn Wilder and Calvin F. Quante in the Journal Vac. Sci. Technol. B 176, November/December 1999, pages 3256 to 3261, discloses a method for lithography, consisting of a cantilever with an integrated transistor to control exposure voltage. The electrons emitted by a microstructured needlepoint act upon a resist made of organic polymer, as a result of field emission. A MOSFET is integrated into the cantilever and controls the dosage of electrons emitted by the point. The cantilever and the point make up the MOSFET's heat sink.

The disadvantages of the state-of-the-art are that the direct imprinting processes and devices that use electrons are too slow in comparison to lithographic projection technologies. Nevertheless, direct imprinting makes possible the manufacture of masks with a very high resolution and reproducibility, and excellent fine structures that are particularly useful for controlling the placement and positioning of patterns and edges.

The problem of the invention is therefore to create a device that makes possible fast and efficient direct imprinting on a wafer or substrate.

The problem is solved by a device according to the invention in that a plurality of microstructured cantilevers are arranged in an array; in that each cantilever in the array contains a bimorphic thermal actuator, a piezoelectric resistance sensor, and a heating element; and in that a power supply and control unit is provided, which is connected with the needlepoint, the heating element, and the piezoelectric resistance sensor; and the needlepoint and the heating element receive appropriate voltage and receive the voltage generated at the piezoelectric resistance sensor.

A further problem of the invention is to create a method that makes possible fast, accurate, and efficient direct imprinting. The throughput of the masks or wafers to be imprinted should be high.

The problem is solved by a method according to the invention that comprises the following steps:
  The bringing together of at least one array with cantilevers, each of which bears a needlepoint, and a surface to be structured, such that the needlepoints are close relative to the surface to be structured;
  Adjustment and regulation of a phase shift of the cantilevers in the arrays with a power supply and control unit, in which case a constant phase shift corresponds to a constant distance between the needlepoint provided for on each cantilever and the surface to be structured;
  Implementation of a relative movement between the minimum of one array with cantilevers and the surface to be structured;
  Application of an electrical voltage to the needlepoint in order to establish an electric field between the needlepoint and the surface to be structured; and
  Regulation of the voltage, depending on the pattern to be created on the surface to be structured.

The device for direct imprinting has the crucial advantage that the device according to the invention comprises an array with cantilevers made of silicon. The cantilevers are made by means of a microscopic manufacturing process, i.e., they are microstructured. Each cantilever is provided in the vicinity of its free end with a needlepoint for gated field emission. The substrate is to be viewed as the anode; the needlepoint as the cathode. The spot size created by the field emission on the substrate can be adjusted by the ratio of anode voltage $V_a$ to cathode voltage $V_c$. The single electron source is a so-called microcathode. In addition, each cantilever has a structure to direct and regulate the cantilever and the field emission emitted by the needlepoints. Directing and regulating has to be understood as, the directing and regulating of the electron beam emitted from the needlepoint and/or the electromagnetic energy applied at the needlepoint.

It is especially advantageous that a plurality of microstructured cantilevers are arranged in an array, in which case an actuator is integrated into each cantilever of the array. A power supply and control Unit is provided, which adjusts the distance of the cantilever relative to the surface to be structured by means of appropriate voltage. Each needlepoint is connected with this power supply and control unit. In a particularly advantageous development, the arrangement of the cantilevers in the array is in a row, and the length of the row is approximately the diameter of the wafer that is carried by the layer to be structured. In order to structure the surface of the substrate to receive the pattern or the surface of the second wafer, at least one array with cantilevers is needed, in which each cantilever bears a needlepoint that is brought together with the surface to be structured such that the distance of the needlepoints is close relative to the surface to be structured. Oscillations are generated in the cantilevers arranged in the array, and the distance between the needlepoints that are provided on each cantilever relative to the surface to be structured is regulated as appropriate or kept at a constant value, respectively. A relative motion between the minimum of one array with cantilevers and the surface to be structured makes possible the structuring of the entire surface. The entire surface of the substrate to be patterned or of the wafer to be structured is covered by a scanning motion. By applying electrical voltage to the needlepoint, an electrical field is generated between the needlepoint and the surface, and the applied voltage is adjusted and regulated, depending on the pattern to be created on the surface. The distance between the needlepoint of the cantilever relative to the surface to be structured is adjusted by means of the measured phase shift of each cantilever. In this case, the direction of the oscillation of the individual cantilevers is vertical to be surface of a substrate or wafer to be patterned or structured. The phase shift is a measurement of the distance of the cantilever relative to the surface to be patterned or structured. It is thus possible to adjust the phase shift to a constant value by adjusting and regulating the voltage, which in turn corresponds to a constant distance between the cantilever and the surface to be structured.

The invention is explained in the following by means of diagrams that show.

Figure 1:
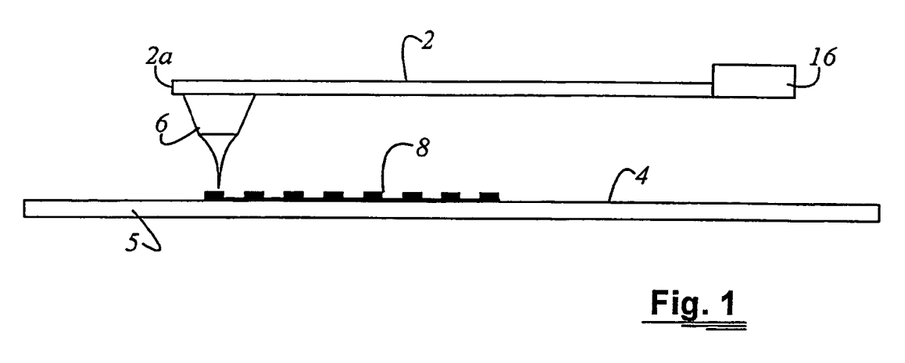
FIG. 1: A lateral schematic diagram of a cantilever in active operation with a surface to be structured.

FIG. 1 shows a lateral schematic diagram of a cantilever 2 in active operation relative to a surface 4 of a substrate (or wafer) 5 to be structured. The cantilever 2 has a needlepoint 6 that is used for adjusting gated field emission and generates a predetermined structure 8 on the surface 4. The needlepoint 6 is a microcathode and thus the electron source for the field emission. The cantilever 2 is connected with a base part 16.

Figure 2:
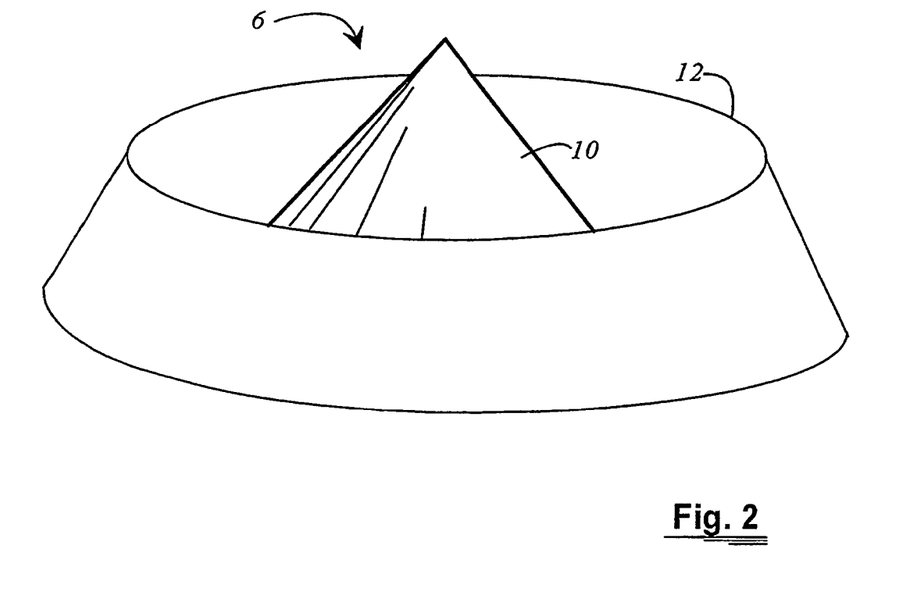
FIG. 2: A detailed schematic diagram of a needlepoint used to emit corpuscular raise generated by field emission.

FIG. 2 shows a detailed diagram of the needlepoint 6 in perspective. The needlepoint 6 consists of the point 10 and a ring 12 that surrounds the point 10 such that the point 10 partially juts out from the ring 12.

Figure 3A:
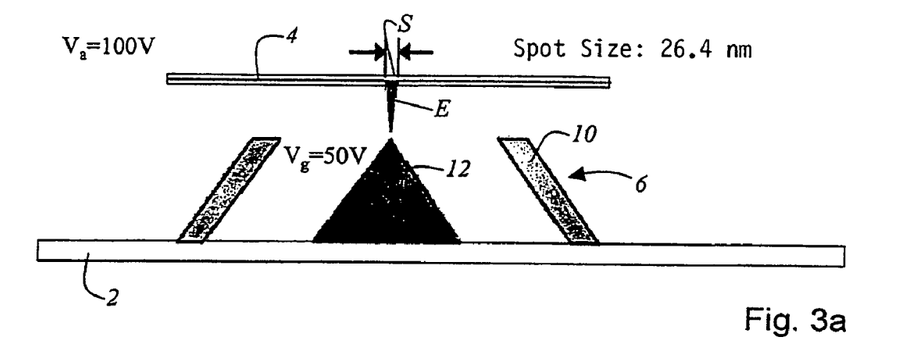
FIG. 3a: A schematic cross-section of the needlepoint in a first ratio between anode voltage and cathode voltage.
Figure 3B:
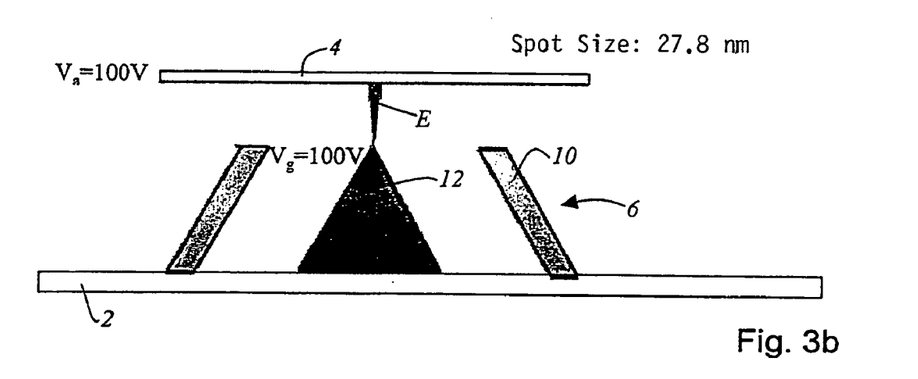
FIG. 3b: A schematic cross-section of the needlepoint in a second ratio between anode voltage and cathode voltage.
Figure 3C:
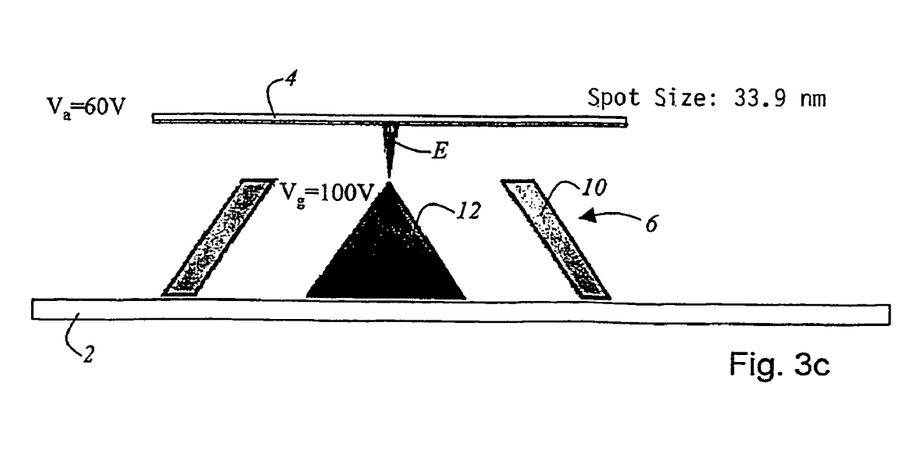
FIG. 3c: A schematic cross-section of the needlepoint in a third ratio between anode voltage and cathode voltage.

FIGS. 3a to 3c show a schematic cross-section of the needlepoint 6 with a first ratio of anode voltage to cathode voltage. As previously described in FIG. 2, the needlepoint 6 consists of a ring 12 that surrounds the point 10. The cathode voltage $V_c$ is applied between the ring 12 and the point. The cathode voltage $V_c$ is always on, and the anode voltage $V_a$ is switched on whenever an electron ray E is needed to imprint on a substrate or on a surface 4 to be structured. As is evident from FIG. 3a, the spot size at a cathode voltage $V_c$ of 100V and an anode voltage $V_a$ of 50V is 26.4 nm.

FIG. 3b is a schematic cross-section of the needlepoint 6 at a second ratio of anode voltage to cathode voltage. As is evident from FIG. 3b, the spot size at a cathode voltage $V_c$ of 100V and an anode voltage $V_a$ of 100V is 27.8 nm.

FIG. 3c is a schematic cross-section of the needlepoint 6 at a third ratio of anode voltage to cathode voltage. As is evident from FIG. 3b, the spot size at a cathode voltage $V_c$ of 60V and an anode voltage $V_a$ of 100V is 33.9 nm.

Figure 4:
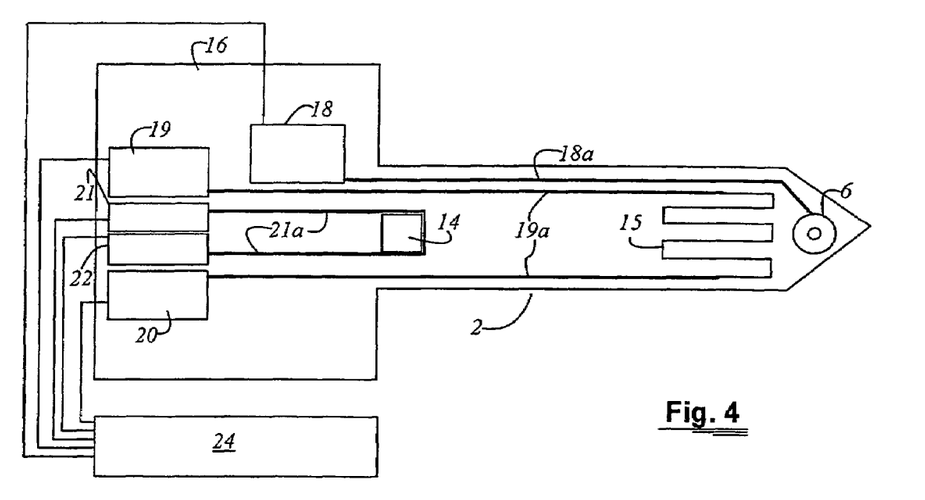
FIG. 4: A diagram of the cantilever with the connections structured into the cantilever for adjusting and controlling the cantilever.

FIG. 4 is a diagram of the cantilever 2 with the wires 18a, 19a, 21a that are integrated into the cantilever and used to adjust and control the cantilever 2. In this embodiment of the invention, the cantilever 2 has a needlepoint 6 for field emission. During the imprinting process, the distance of the needlepoint 6 of a cantilever 2 is close relative to the surface 4 of the storage medium to be structured (see FIG. 1), which may be a wafer or a mask for lithography. During the imprinting process, the cantilever 2 oscillates or vibrates, as does the needlepoint 6 that is provided at the free end 2a of the cantilever 2. The oscillation frequency is the resonance frequency (ground frequency or an eigenmode thereof. Because the needlepoint 6 of the cantilever 2 is extremely close relative to the surface 4 of the substrate 5 to be structured, the resonance frequency is partially dependent on the van der Waals forces and/or other additional forces that lead to damping. Damping is dependent on the magnitude of the active forces, which leads to a phase shift in the resonance frequency. For this reason, there is a phase shift between the resonance frequency of the cantilever 2, which is far distant relative to the surface 4 to be structured, and the cantilever 2, which is close to the surface 4 to be structured. In reality, it is the gradient of these forces that leads to the phase shift in the resonance frequency of the cantilever 2. When the distance between the needlepoint 6 and the surface 4 of the substrate 5 changes, these forces also change, and the phase shift in the resonance frequency of the cantilever 2 changes in the opposite direction.

Figure 5:
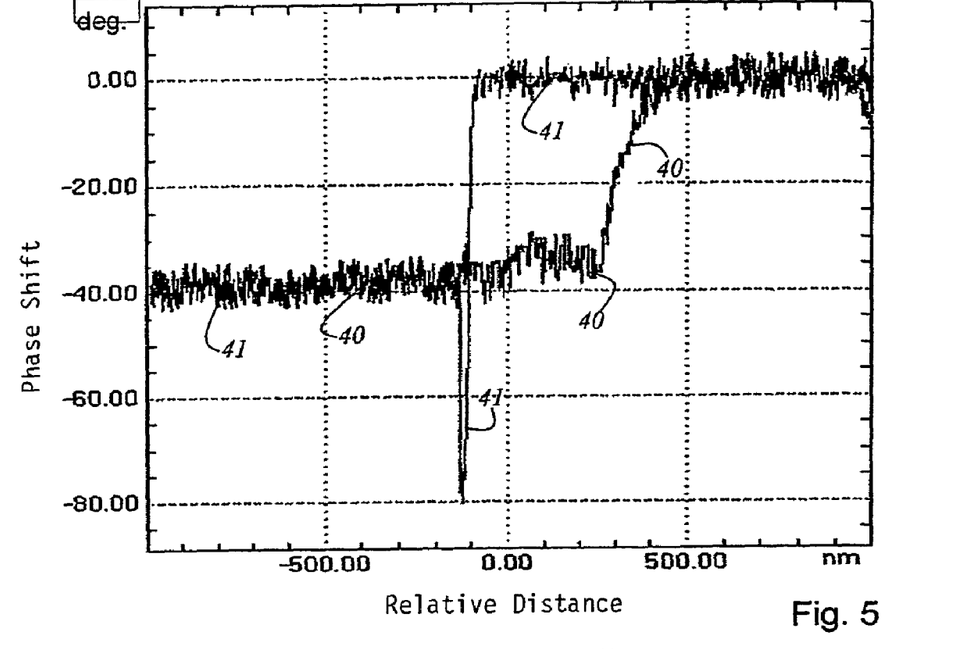
FIG. 5: A graph of the phase shift of the oscillating cantilever during remove and approach relative to the surface to be structured.

FIG. 5 is a graph of the phase shift during the remove and approach of the needlepoint 6 provided to the cantilever 2. The x-axis shows the distance of the needlepoint 6 relative to the surface 4 to be structured. The y-axis shows the phase shift during the approach and remove. A first curve 40 represents the distance of the needlepoint 6 relative to the surface 4 to be structured. If the needlepoint 6 is located close to the surface 4 to be structured, there is in this case, for example, a phase shift of approximately 40°. At the relative zero crossover shown in the graph, the phase shift eventually begins to lessen, and at a certain relative distance reaches 0°. When the needlepoint 6 approaches the surface 4 to be structured, the phase shift remains 0° and then increases at a certain distance in the vicinity of the relative zero crossing to a total of −80° and adjusts to −40°. The region of the first curve 40 that exhibits the less degraded increase 40a can be used to adjust a particular phase shift, and therefore also a particular distance between the needlepoint 6 and the surface 4 to be structured.

The resonance frequency or the phase shift, respectively, of the cantilever 2 is precisely determined, and a power supply and control unit 24 makes it possible to adjust appropriately the distance between the needlepoint 6 and the surface 4 of the substrate 5 such that the phase shift is kept constant. The result is that the distance between the substrate surface and the needlepoint 6 of the cantilever 2 is also kept constant. This distance must be precisely monitored or adjusted in order to ensure that only the desired area of the storage medium on the surface 4 of the substrate 5 is subject to electron radiation in order to prevent damage, or to keep the needlepoint 6 from colliding with the surface 4 to be structured. Alternatively, the oscillations of the cantilever 2 can be adjusted. This information can be used to control the distance between the surface 4 of the recording medium or of the surface 4 of the substrate 5, respectively, relative to the imprinting needlepoint 6 of a cantilever 2.

The cantilever 2 (see FIG. 4) is provided with a piezoelectric resistance sensor 14, which is directly integrated into the cantilever 2. Detection occurs in that the resistance, and therefore the voltage, changes at the piezoelectric resistance sensor 14 with each bend of the cantilever 2. Changes in resistance are determined by the piezoelectric resistance sensor 14, and these create a signal that indicates the phase shift of the cantilever 2. This information is corrected via the connections 21 and 22 to a power supply and control unit 24 in order to adjust and regulate the distance of the needlepoint 6 relative to the surface 4 of the substrate 5. The cantilever 2 has a base part 16 onto which an electric connection 18 for the needlepoint 6 and a conductor 18a leading from the connection 18 to the needlepoint 6 are structured. Electrical connections 19 and 20, each of which is connected with a conductor 19a and that provide voltage to a heating element 15, are structured into the base part 16.

The cantilever 6 preferably possesses a bending section that has a high mechanical resonance frequency, and a vibration section that has a low mechanical resonance frequency.

Figure 6:
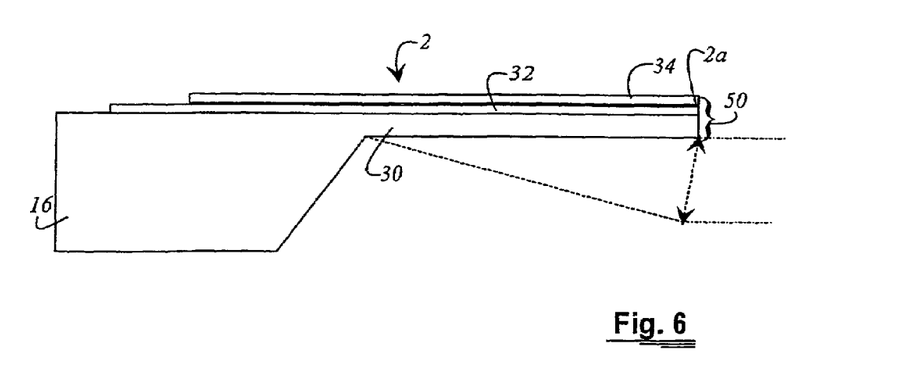
FIG. 6: A schematic diagram of the layering of the cantilever.

The cantilever 2 vibrates because of a bimorphic thermal actuator 50 that is integrated into the cantilever 2 or is a part of the cantilever 2. The structure of the bimorphic thermal actuator 50 is described schematically in FIG. 6. A superimposed AC (alternating current) and DC (direct current) signal is applied at the connections 19 and 20 shown in FIG. 5. The alternating current components cause the cantilever to vibrate, and the direct current components supply voltage for the heating element 15, which causes the cantilever 2 to bend. In addition, a specific voltage can be used to adjust for a particular distance between the cantilever 2 and the surface 4 of the substrate 5 to be structured. The bimorphic thermal actuator 50 provided for in the cantilever 2 consists of three layers. The first layer 30 is made of silicon (Si), the second layer 32 is of silicon dioxide (Sio2), and the third layer 34 is of aluminum (Al). The movement of the free end 2a of the cantilever 2 can be described by Equation 1.

$$z_y = 3K\Delta T l^2 \qquad \text{Equation 1}$$

in which case K is calculated according to Equation 2:

$$K = \frac{(a_1 - a_2)(d_1 - d_2)\frac{1}{l^2}}{4 + 6\left(\frac{d_1}{d_2}\right) + 4\left(\frac{d_1}{d_2}\right)^2 + \left(\frac{d_1}{d_2}\right)^3\left(\frac{E_1}{E_2}\right) + \left(\frac{d_2 E_2}{d_1 E_1}\right)} \qquad \text{Equation 2}$$

Here, d is the thickness of the material used, l is the length of the cantilever 2, E is the Young's module, and α the thermal expansion coefficient of a material used in the cantilever 2. The following table shows the E-modules and the thermal expansion coefficient of the materials used in the cantilever 2.

| Material | E-module (or Young module) | Thermal expansion coefficient |
| --- | --- | --- |
| Silicon (Si) | 170 GPa | 2.3 × 10⁻⁶ 1/° K |
| Silicon dioxide (SiO2) | 75 GPa | 0.4 × 10⁻⁶ 1/° K |
| Aluminum (Al) | 70 GPa | 23 × 10⁻⁶ 1/° K |

Equation 2 contains only the thermal expansion coefficients of aluminum and silicon dioxide. Neglecting the thermal expansion coefficient leads to a negligible error of approximately 3% in Equation 2.

Figure 7:
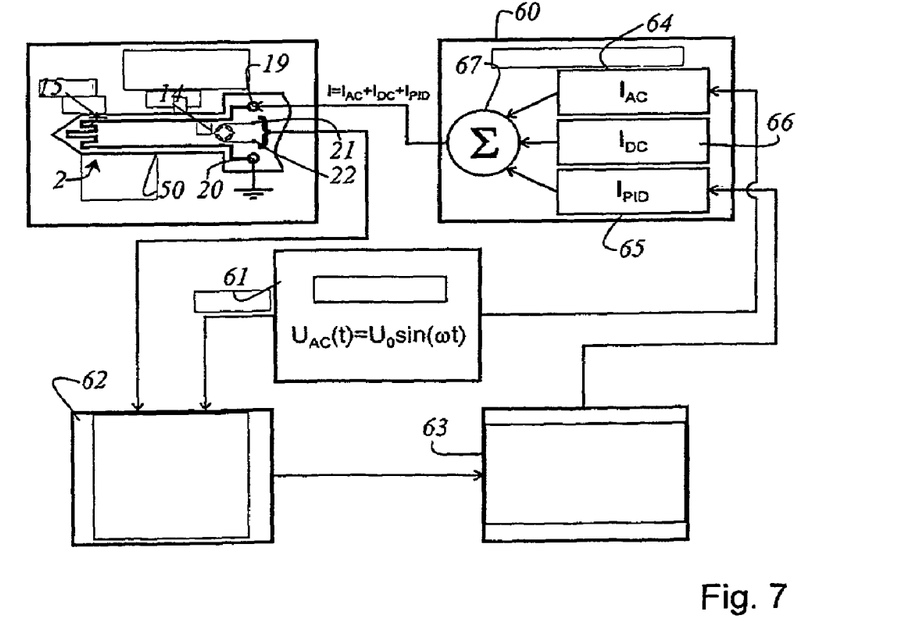
FIG. 7: A detailed diagram of the wiring of the cantilever with its power supply and control unit.

FIG. 7 is a detailed diagram of the switching of the cantilever 2 with the power supply and control unit 24, which consists of a power source 60, a voltage generator 61, a phase inhibition circuit 62 and a PID controller 63. As mentioned above, the cantilever 2 is provided with a heating element 15 that bends the cantilever 2 when it receives voltage from the bimorphic thermal actuator 50 that is integrated into the cantilever. The piezoelectric resistance sensor 14 has two connections 21 and 22 that are connected to the phase inhibition circuit 62 of the power supply and control unit 24. The phase inhibition circuit 62 receives the voltage measured by the piezoelectric resistance sensor 14, which is a measurement of the bending of the bimorphic thermal actuator 50. In the same way, the phase inhibition circuit 62 receives voltage from the voltage generator 61, which is integrated into the power supply and control unit 24. The voltage generator 61 delivers an alternating voltage signal $U_{ac}$ (see Equation 3)

$$U_{AC}(t) = U_o \sin(\omega t) \qquad \text{Equation 3}$$

to the alternating voltage source 64 provided for in the voltage source 60. The phase inhibition circuit 62 delivers a signal to the PID controller 63. The power source includes the alternating voltage source 64 the PID voltage source 65, and a direct voltage source 66. The alternating voltage source 64, the PID voltage source 65, and a direct voltage source 66 each deliver their voltage intensity levels to an accumulator 67. The accumulator 67 is connected to an electrical connection 19 for the heating element 15. The second electrical connection 20 is grounded. The heating element receives voltage as shown in Equation 4.

$$I = I_{AC} + I_{DC} + I_{PID} \qquad \text{Equation 4}$$

The cantilever 2 is powered by a bimorphic thermal actuator 50 with a resonance frequency $f_{RES}$ and an alternating voltage that correspond to half the resonance frequency $f_{RES}/2$. The direct voltage leads to a deflection of the cantilever 2 vertical to the surface 4 to be structured. The distance between the cantilever 2 and the surface 4 to be structured is regulated by the PID controller 63 and adjusted to a desired level (P=proportional, I=integrator, D=differentiator). The piezoelectric resistance sensor 14 delivers an initial signal, which is picked off by the electrical connections 21 and 22. The initial signal is compared with this voltage level, which corresponds to the desired distance of the needlepoint 6 relative to the surface 4 of the substrate 5. If the distance that has been determined by the vibrational frequency of the cantilever 2 is outside of that range, an error signal is generated. The error signal is then delivered to the PID controller 63 of the voltage and control unit 24, which then adjusts the direct voltage components of the signal. This, in turn, generates a change in the distance between the needlepoint 6 and the surface 4 of the substrate 5 until the error signal is nullified.

Figure 8:
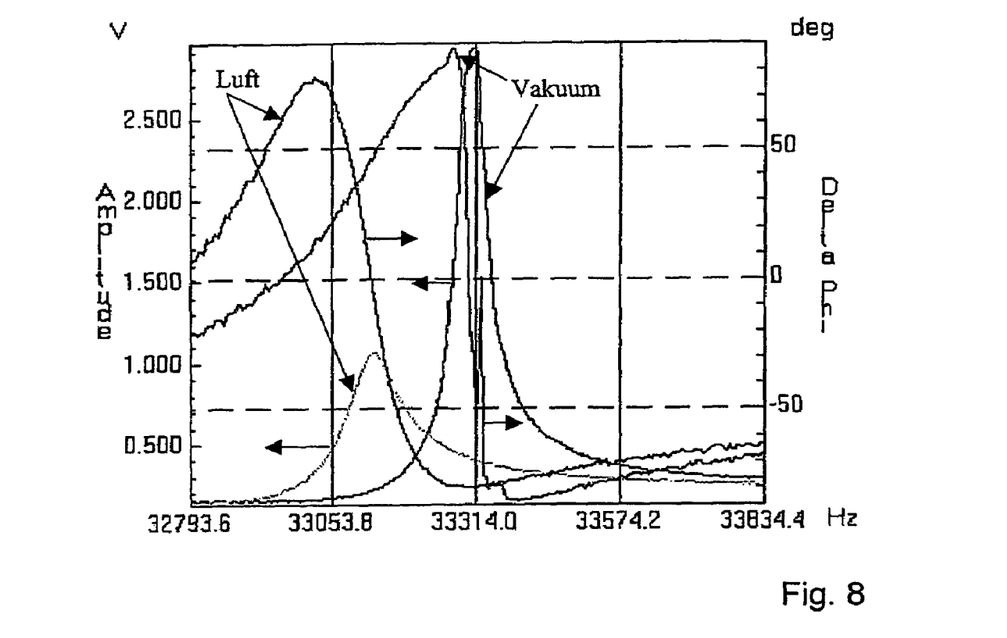
FIG. 8: A graph of the resonance and phase shift of a cantilever, both in vacuum and in air.

FIG. 8 is a graph of the resonance and phase shift of a cantilever both in a vacuum and in air. The first resonance of the cantilever 2 in air shows a significant broadening at the peak in contrast to the resonance in vacuum. In addition, the position of the resonance peak of the cantilever in air has been shifted to a lower frequency. Significant broadening is caused by the damping effect of air molecules. The phase shift of the cantilever 2 in vacuum shows a less extreme change in phase shift in the area of the resonance frequency than does the change in the phase shift of the cantilever in air.

Figure 9:
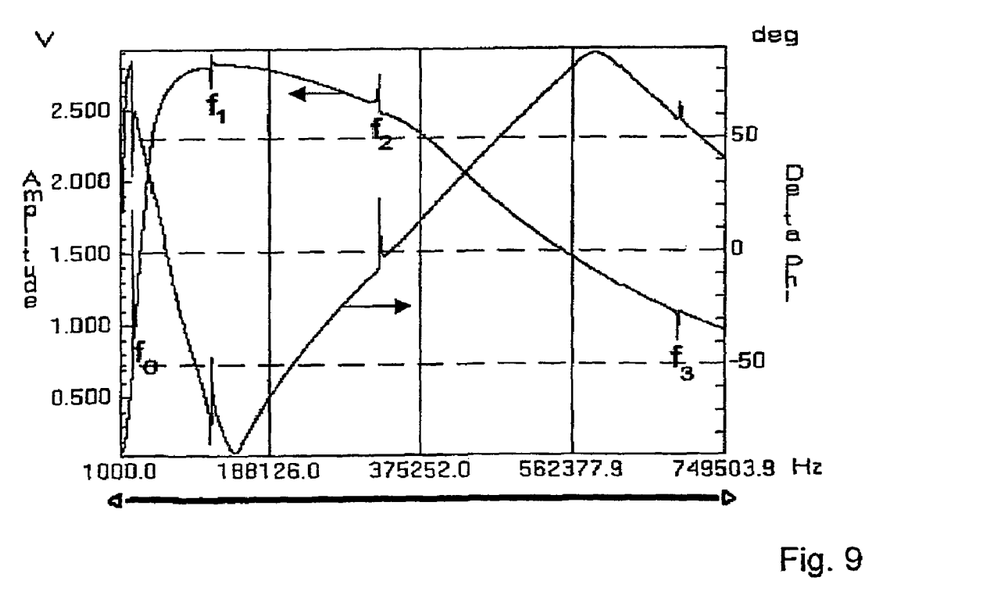
FIG. 9: A graph of the voltage measured with the piezoelectric resistance sensor as a function of the frequency at which the cantilever vibrates or oscillates.

FIG. 9 is a graph of the voltage measured by the piezoelectric resistance sensor as a function of the frequency at which the cantilever 2 vibrates. In the graph in FIG. 8, the frequency of the ground resonance $f_0$ is scanned until it exceeds the third eigenmode $f_3$. The ground resonance frequency $f_0$ of the first eigenmode $f_1$, the second eigenmode $f_2$, and the third eigenmode $f_3$ stand out in the amplitude function as sharp peaks. The peaks of the eigenmodes are allocated in the function for the peaks corresponding to the phase shifts. A higher speed can be achieved at higher eigenmodes in processing the surface 4 to be structured. In the same way, higher eigenmodes are consistent with greater sensitivity and resolution of force.

Figure 10:
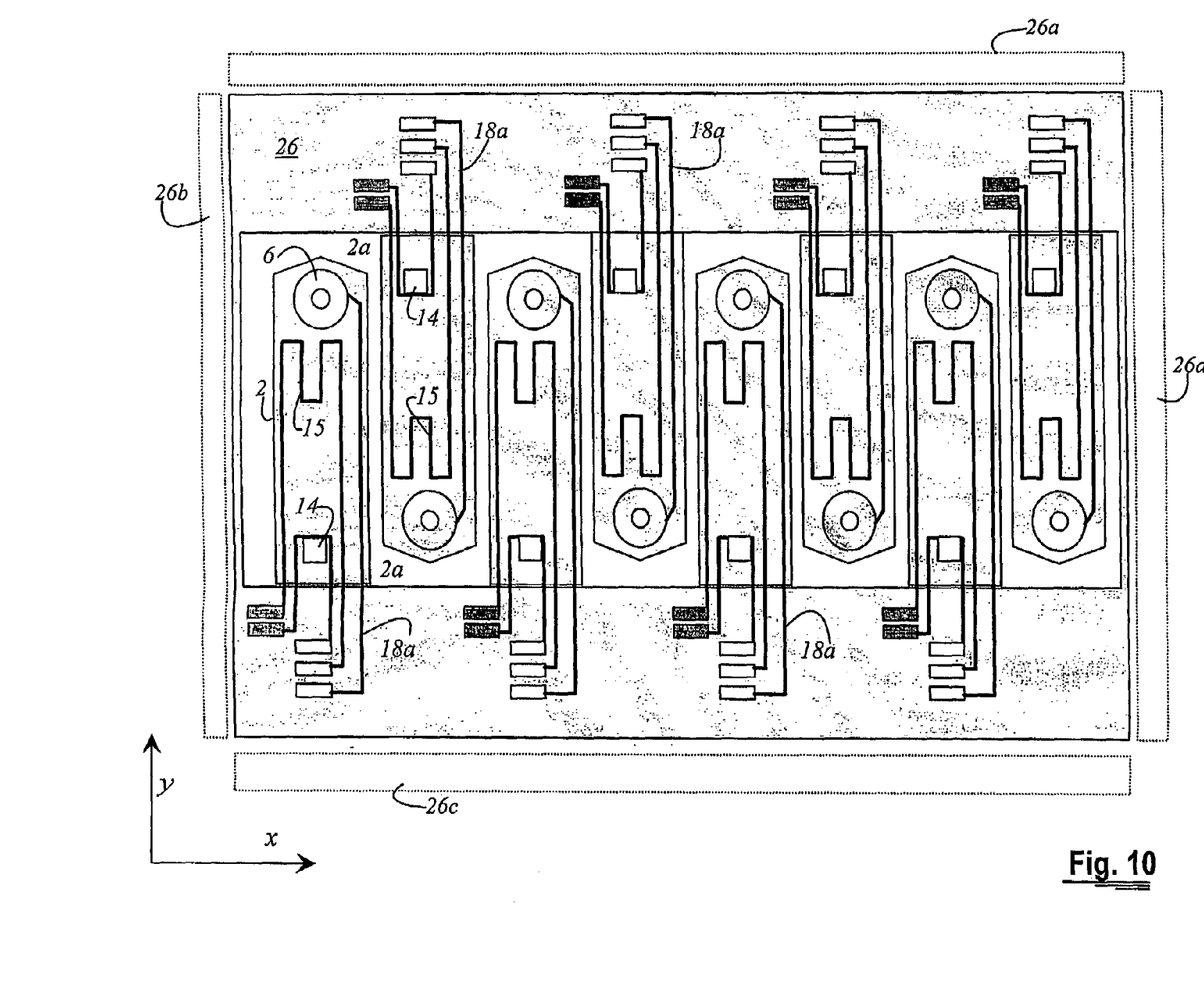
FIG. 10: An embodiment of an array arrangement of a plurality of cantilevers for maskless microlithography.

As shown in FIG. 10, the device for maskless microlithography consists of an array 26 in which the cantilevers 2 are arranged. The array 26 is made of silicon and manufactured using a microstructure in process. According to this preferred embodiment of the invention, the array 26 of cantilevers 2 is formed in a first wafer that has the same size as a second wafer onto which the pattern is to be imprinted. In order to cover the entire surface of the second wafer, a plurality of arrays 26a, 26b, 26c, 26d, . . . are arranged in mosaic form on the surface of the first wafer. The plurality of arrays 26a, 26b, 26c, 26d, . . . are shown in FIG. 9 as broken frames. A pattern will be imprinted on a second wafer by means of the lithographic process. The first and the second wafer each contain semiconductor regions that are congruent to each other. As already mentioned above, the cantilevers 2 are situated in one or a plurality of rows in each of the semiconductor regions of the first wafer. The first and the second wafer are then brought together "face-to-face." This means that the needlepoints 6 of the cantilevers 2 of the first wafer are situated close to the surface 4 of the second wafer, in which case those needlepoints 6 are selected for patterning by the electrons emitted from the individual needlepoints 6 of the cantilevers 2. The second wafer, which is to be radiated or patterned, respectively, is then scanned such that the needlepoints 6 of the cantilevers 2 of the first wafer describe the entire surface of the second wafer and cover it. This takes place when a relative movement is carried out between the first and the second wafer for the purpose of carrying out the scanning movement. In the case of a wafer that is 200 mm in diameter and where the density of needlepoints 6 is 20 points/mm², 600,000 individual needlepoints need to be activated in the mosaic-like arrangement of the array. By contrast, the entire movement of the second wafer that is below it is only approximately 1 mm in the x- and the y-direction during the radiation process.

Another possible arrangement of the cantilevers 2 can be in a narrow strip. The individual cantilevers 2 are arranged in a row and form a strip, which, for example, extends over the entire diameter of the wafer (i.e., the second wafer) to be radiated or structured. While the wafer is being radiated, the strip also completes a broad movement such that the entire surface of the second wafer is scanned during radiation. Another possible arrangement is in a small square segment (a spatial arrangement of a plurality of cantilevers [2]). The segment is significantly smaller than the second wafer to be imprinted. In order to imprint the entire second wafer, the segment must be moved and controlled over larger distances along the x- and y-coordinates.

The needlepoints 6 of the cantilevers 2 can, for example, be used to apply a strong field to each needlepoint 6 in the arrangement of the arrays 2 by way of the conductor. Oxidation takes place on the top layer of the second wafer in the presence of steam. The top layer or surface of the second wafer may, for example, consist of silicon, chrome, or titanium.

In addition, each needlepoint 6 in the arrangement of arrays may be used to imprint the desired pattern onto a layer of soft material. Such a layer may, for example, consist of a thin polymethylmetacrylate film (PMMA).

In a further application, it is necessary to regulate precisely the neutral position of the cantilevers 2. Taking into consideration that there are unevennesses and/or topography on the surface of the second wafer, the cantilevers 2 are designed such that they are able to bend to a certain extent.

A method can be implemented with the device that makes possible maskless electron radiation lithography on a substrate or a wafer, respectively, with, for example, a layer consisting of a resist. To this end, at least one array 24 of cantilevers 2 is available, in which case a piezoelectric resistance sensor 14 is provided on the firm based part 16. The cantilever 2 is formed on a silicon wafer, and each of the cantilevers 2 disposes over a needlepoint 6 for gated field emission, in which case the needlepoint 6 is provided in the vicinity of the free end 2a of the cantilever 2. As already described in FIG. 5, the bimorphic thermal actuator 50 is integrated into the cantilever. The cantilever 2 and the second wafer or substrate that surrounds the resist are brought together, in which case the needlepoints 6 of the cantilevers 2 are situated opposite the surface 4 to be structured on the substrate 5 (wafer). The surface can, for example, consist of a layer of resist. In order to imprint on the surface 4, the array 24 of the cantilevers 2 is scanned over the surface 4 of the substrate 5 that, for example, bears a resist. The step-by-step scanning can be done such that the first wafer that bears the cantilever 2 and the second wafer that bears the resist can oscillate back and forth along a first axis. The first axis may be, for example, the y-axis of a Cartesian coordinate system. The first wafer that bears the cantilever and the second wafer that bears the resist are moved along the x-axis, which is generally vertical to the y-axis. A stream of the field electrons flows between the needlepoint 6 of the cantilever 2 and the second wafer that bears the resist; said stream can be interrupted in a controlled way that corresponds to the pattern to be imprinted on the second wafer. The resist layer on the second wafer is exposed to a variety of selected lithographic patterns by the electron radiation of the field emission.

During scanning, the needlepoints 6 for field emission are close to the surface 4 of the substrate 5 or to the second wafer that bears the resist, respectively. In order for the cantilevers 2 or at least the free ends 2a of the cantilevers 2 to approach the surface 4, the cantilever 2 is able to bend, and the alternating voltage can be adjusted in order to control and regulate distance relative to the surface. Detection of piezoelectric resistance is used for this purpose.

The vibration of the cantilevers 2 is achieved by applying alternating voltage to a thermal bimorphic operating element that is allocated to each cantilever 2. The vibration frequency of each cantilever 2 detected with the piezoelectric resistance sensor 14 that adjusts the distance between the needlepoint 6 of the cantilever 2 and the surface 4 of the substrate 5. The oscillations and the direction, respectively, of the vibration of the individual cantilevers 2 are vertical to the surface 4 of a substrate 5 or wafer to be patterned or structured. The oscillations of the cantilevers 2 are detected by means of a piezoelectric resistance sensor 14, which is integrated into the cantilever 2, such that their resistance changes with each bending of the cantilever 2. Resistance of the piezoelectric resistance sensor 14 is determined, which makes available a signal that indicates the resonance frequency of the cantilever 2, in which case a feedback system is used to regulate the distance between the needlepoint 6 and the surface 4 of the resist, or of the surface 4 of the substrate 5.

The cantilevers 2 are permitted to vibrate to adjust the distance. To this end, an alternating-voltage/direct-voltage signal is superimposed in a thermal bimorphic actuator element that is integrated into each cantilever. Resistance measurement is coupled to the resistance of the piezoelectric resistance sensor 14 to measure the resistance, and to generate a signal corresponding to the oscillations of the cantilevers 2. The bimorphic actuator element is used to generate the oscillations of the cantilevers 2.

An electrical preload is applied to each needlepoint 6. The electrical field is then interrupted. The electrical field is switched on and off in accordance with the data to be imprinted, as a result of which the resist layer is then caused to generate a variety of designed lithographic patterns on a medium on the surface 4 of the substrate 5.

Figure 11:
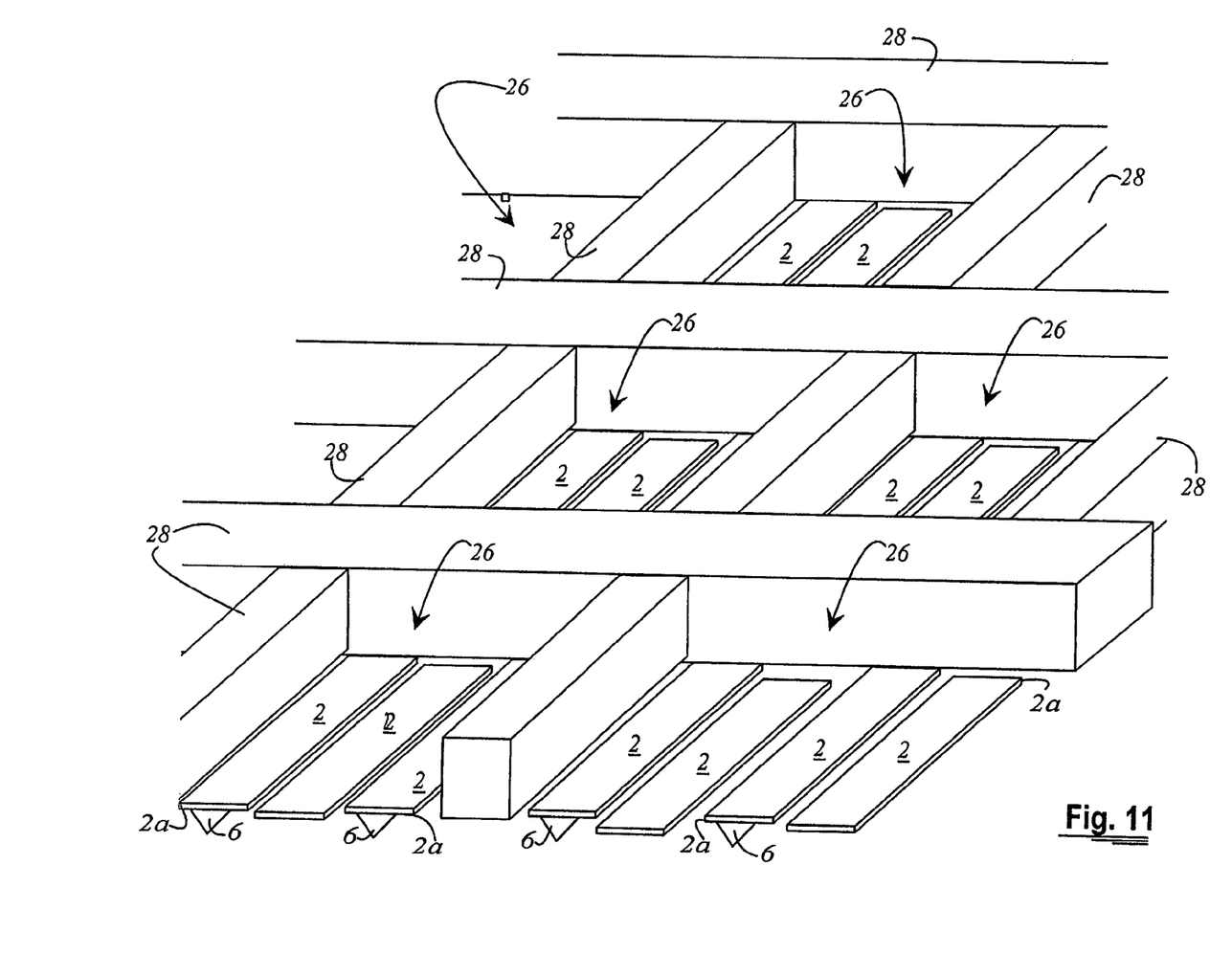
FIG. 11: A perspective diagram of a matrix arrangement of a plurality of cantilevers for maskless microlithography.

FIG. 11 shows a partial diagram in perspective of an arrangement of a plurality of arrays 26 in a high-resolution microlithographic system produced in, on, or by a silicon wafer. The individual arrays are separated from each other by partitions 28 of the silicon wafer. Each cantilever 2 contains a gating emitter for the field emission (source of electrons with a very narrow energy band) in the vicinity of the free end 2a of the cantilever 2. The gating field emitter is a needlepoint 6. Each gating field emitter is connected electrically via passageways 29 in the partitions 28 of the wafer to a power supply and control unit 24.

The arrangement of the arrays 26 of the cantilevers 2, and of the gating emitters for field emission that are integrated into the cantilevers, are arranged above the second wafer (substrate) that is to be patterned by the electrons emitted by the emitters.

The arrangement of the arrays of the cantilevers 2 scans over the second wafer (substrate), in which case an address gate of 1 nm or less is used. Preferably, the method is implemented in a manner similar to a scanner. The individual power supply and control unit 24 is operated such that the voltage of the field emission or electrical field at the needlepoint 6 for gated field emission of a cantilever 2 is under high-frequency control (2–10 MHz).

The electrons released by field emission are used to imprint the pattern on an electron-sensitive resist, which has been applied to the surface 4 of the substrate 5 (in the case of conventional mask lithography), or directly on the surface of the wafer itself (in the case of maskless lithography).

A surface of 1 mm$^2$ can be patterned in 200 seconds with a cantilever 6 oscillating any frequency of 2 MHz and a scanning speed of 100 mm/second.

With an arrangement of 20 samples per mm$^2$, a surface of 1 mm$^2$ can be imprinted in 10 seconds. If 10,000 cantilevers are used in an array, it is possible to pattern a 200 mm wafer with a surface area of $3 \times 10^4$ mm$^2$ in an imprint time of 10 minutes.

If gated field emission is used with high-voltage, which makes it possible to work with a changeable spot size (e.g., 30 to 150 mm$^2$), the imprint time (or the number of imprint cantilevers) per wafer can be significantly reduced.

The invention has been described in relation to a particular embodiment. It will be clear to a person skilled in the art that deviations and modifications may be implemented without abandoning the full extent of protection of the claims.

REFERENCE NUMBER LIST

2 Cantilever
2a Free end
4 Surface
5 Substrate
6 Needlepoint
8 Structure
10 Point
12 Ring
14 Piezoelectric resistance sensor
15 Heating element
16 Base part
18 Connection
18a Conductor
19 Connection
19a Conductor
20 Connection
21 Connection
22 Connection
24 Power supply and control unit
26 Array
28 partition
29 passageway
30 first layer
32 second layer
34 third layer
40 first curve
41 second curve
50 bimorphic thermal actuator
60 power source
61 voltage generator
62 phase inhibition circuit
63 PID controller
64 alternating voltage source
65 PID voltage source
66 direct voltage source
67 accumulator

The invention claimed is:

1. Device for maskless microlithography with a microstructured cantilever 2, which bears a needlepoint 6 at a free end 2a, characterized in that a plurality of microstructured cantilevers 2 are arranged in an array 26; in that each cantilever 2 of the array 26 contains a bimorphic thermal actuator 50, a piezoelectric resistance sensor 14, and a heating element 15; and in that a power supply and control unit 24 is provided that is connected with the needlepoint 6, the heating element 15, and the piezoelectric resistance sensor 14, and the needlepoint 6 and the heating element 15 are suitably powered and receive the voltage generated by the piezoelectric resistance sensor 14.

2. Device according to claim 1, characterized in that the needlepoint 6 consists of a point 10 and a ring 12, and in that a cathode voltage $V_C$ is applied between the ring 12 and the point 10, which acts as standby voltage.

3. Device according to claim 2, characterized in that the ratio between the cathode voltage $V_c$ and an anode voltage $V_a$ regulates the spot size of electron radiation E on a surface 4 to be structured.

4. Device according to claim 1, characterized in that the power supply and control unit 24 consists of a power source 60, a voltage generator 61, a phase inhibition circuit 62, and a PID controller 63, in which case the power source 60 includes an alternating voltage source 64, a PID voltage source 65, and a direct voltage source 66.

5. Device according to claim 1, characterized in that the phase inhibition circuit 62 receives the voltage measured by the piezoelectric resistance sensor 14, and the phase inhibition circuit 62 receives voltage from the voltage generator 61, and the phase inhibition circuit 62 delivers a signal to the PID controller 63 and, in turn, the PID controller 63 delivers a signal to the PID power source 65 that is provided for in the power source, and the voltage generator 61 delivers an alternating voltage signal to the alternating voltage source 64 that is provided for in the power source 60.

6. Device according to claim 5, characterized in that the an accumulator 67 is provided for in the power source 60 that accumulates the voltage from the alternating voltage source 64, the voltage from the PID power source 65, and the voltage from the direct voltage source 66, and is connected to a heating element 15 by means of an electrical connection 19.

7. Device according to claim 1, characterized in that the power supply and control unit 24 determines the phase shift of the cantilever 2, and in that the power supply and control unit 24 adjust and keep constant the distance of the needlepoint 6 relative to the surface 4 of the substrate 5 to be structured, in which case the phase shift is kept at a constant size.

8. Device according to claim 1, characterized in that the surface 4 to be structured represents the surface of a wafer that is covered with a layer of a material to be structured.

9. Device according to claim 7, characterized in that the arrangement of the cantilevers 2 in an array 26 is in the form of a row, and in that the length of the row approximates the diameter of the wafer that bears the layer to be structured.

10. Device according to claim 7, characterized in that the arrangement of the cantilevers 2 in the array 26 is in the form of a spatial matrix.

11. Device according to claim 10, characterized in that a plurality of spatial matrix arrangements of the cantilevers 2 in the array 26 are arranged like a mosaic, and wherein the mosaic-like arrangement corresponds approximately to the area of the surface 4, the second wafer, or the substrate to be structured.

12. Device according to claim 1, characterized in that the cantilevers 2 are provided with structured conductors 18a and 19a to regulate and control the cantilever 2, and in that each cantilever 2 is provided with a base part 16 on which a plurality of electrical connections 19, 20, 21, 22 are structured.

13. Device according to claim 1, characterized in that the bimorphic thermal actuator 50 consists of three layers, in which case a first layer 30 is made of silicon (Si), a second layer 32 is of silicon dioxide ($SiO_2$), and a third layer 34 is of aluminum (Al).

14. Device according to claim 1, characterized in that a plurality of arrays 26 are arranged on a silicon wafer, in which case the individual arrays 26 are separated from each other by partitions 28 made of silicon, and in that the connection to the power supply and control unit 24 is via the passageways 29 in the partitions.

15. Method for maskless lithography, consisting of the following steps:

Bringing together at least one array 26 with cantilevers 2, of which each bears a needlepoint 6, with a surface to be structured 4 such that the needlepoints 6 are arranged close to the surface 4 to be structured;

Adjusting and regulating a phase shift of the cantilevers 2 in the arrays 26 with a power supply and control unit 24, in which case a constant phase shift corresponds to a constant distance of the needlepoint 6 that is provided on each cantilever 2 relative to the surface 4 to be structured;

Implementation of a relative movement between the minimum of one array 26 with cantilevers 2 and the surface 4 to be structured;

Application of an electrical voltage to the needlepoint 6 in order to generate an electrical field between the needlepoint and the surface 4 to be structured; and Regulation of the voltage, in accordance with the pattern to be generated on the surface 4 to be structured.

16. Method according to claim 15, characterized in that the distance between the needlepoint 6 of the cantilever 2 and the surface 4 to be structured is changed by means of a heating element 15 provided for in the cantilever 2, and in which a bimorphic thermal actuator 50 is integrated into the cantilever 2.

17. Method according to claim 15, characterized in that the power supply and control unit 24 consists of a power source 60, a voltage generator 61, a phase inhibition circuit 62, and a PID controller 63, in which case the power source 60 includes an alternating voltage source 64, a PID voltage source 65, and a direct voltage source 66.

18. Method according to claim 15, characterized in that the phase inhibition circuit 62 receives the voltage measured by the piezoelectric resistance sensor 14 and the phase inhibition circuit 62 receives voltage from the voltage generator 61, and the phase inhibition circuit 62 delivers a signal to the PID controller 63 and, in turn, the PID controller 63 delivers a signal to the PID power source 65 that is provided for in the power source, and the voltage generator 61 delivers an alternating voltage signal to the alternating voltage source 64.

19. Method according to claim 16, characterized in that the power from the alternating voltage source 64, the power from the PID voltage source 65, and the power from the direct voltage source 66 are delivered to the heating element 15 by way of an accumulator 67 in the power source 60.

20. Method according to claim 15, characterized in that the power supply and control unit 24 determines the phase shift of the cantilever 2, and in that the power supply and control unit 24 adjust and keep constant the distance of the needlepoint 6 relative to the surface 4 of the substrate 5 to be structured, in which case the size of the phase shift is kept constant.

21. Method according to claim 15, characterized in that the application of electrical voltage to the needlepoint 6 is implemented by means of a power supply and control unit 24.

22. Method according to claim 21, characterized in that the individual power supply and control unit 24 operates such that alternating voltage is applied to the heating element 15 such that the cantilever 2 is made to oscillate at a frequency of 1–15 MHz.

23. Method according to claim 22, characterized in that the resonance frequency and at least three eigenmodes of the cantilevers 2 lie within the range of frequencies at which the cantilevers 2 oscillate.

* * * * *